US006591997B2

United States Patent
Hung

(10) Patent No.: US 6,591,997 B2
(45) Date of Patent: Jul. 15, 2003

(54) FACE PLATE BRACKET OF A COMPUTER RACK ASSEMBLED FOR SHELVING ELECTRONIC EQUIPMENTS

(76) Inventor: Kuo-Chuan Hung, P.O. Box No. 6-57, Chung-Ho, Taipei 235 (TW)

( * ) Notice: Subject to any disclaimer, the term of this patent is extended or adjusted under 35 U.S.C. 154(b) by 0 days.

(21) Appl. No.: 09/975,940

(22) Filed: Oct. 15, 2001

(65) Prior Publication Data

US 2003/0071002 A1 Apr. 17, 2003

(51) Int. Cl.[7] .................................................. A47F 5/00
(52) U.S. Cl. ........................ 211/183; 211/26; 211/189; 361/683; 312/265.4
(58) Field of Search .......................... 211/26, 189, 182, 211/183; 312/265.1, 265.2, 265.3, 265.4, 265.6, 265.5, 223.2; 361/683

(56) References Cited

U.S. PATENT DOCUMENTS

| | | | | |
|---|---|---|---|---|
| 5,571,256 A | * | 11/1996 | Good et al. | ............... 211/26 |
| 5,806,945 A | * | 9/1998 | Anderson et al. | ......... 312/265.3 |
| 5,807,008 A | * | 9/1998 | Schwenk et al. | .... 312/265.1 X |
| 6,202,860 B1 | * | 3/2001 | Ludwig | ...................... 211/26 |
| 6,230,903 B1 | * | 5/2001 | Abbott | ......................... 211/26 |
| 6,305,556 B1 | * | 10/2001 | Mayer | .......................... 211/26 |
| 6,338,413 B1 | * | 1/2002 | Walter et al. | ................. 211/26 |

* cited by examiner

Primary Examiner—Robert W. Gibson, Jr.
(74) Attorney, Agent, or Firm—Troxell Law Office PLLC

(57) ABSTRACT

A face bracket of a computer rack assembled for shelving electronic equipment is in the form of a long plate body. A first longitudinal edge of the long plate body is disposed with a right-angle bent edge. A second longitudinal edge has a bent edge extends with two right-angle bends to form a bent portion in a n-shape. Lock holes are disposed at a certain distance on the plate surface of the long plate body. The face plate bracket is fixedly locked on the inner side of an aluminum extruded machine rack frame so as to fix an expansion rod bracket for shelving the main set between two expansion rod brackets.

2 Claims, 3 Drawing Sheets

FACE PLATE BRACKET OF A COMPUTER RACK ASSEMBLED FOR SHELVING ELECTRONIC EQUIPMENTS

BACKGROUND OF THE INVENTION

1. Field of the Invention

The present invention provides a face plate bracket of a computer rack assembled for shelving electronic equipments. More specially a face plate bracket, exclusively applied onto an aluminum extruded machine rack frame, being specially designed to be able to press on an aluminum extruded machine rack frame post and to be screwed for locking, thereby to fully facilitate the erection of the electronic equipments such as a computer.

2. Description of the Prior Art

Typically, industrial computer (or the related electronic) equipment are more advanced products with higher price. In order to maintain their useful life and to avoid too much dust, the industrial computer equipment are usually installed in an enclosed machine rack. Most of the conventional machine racks are customer-made case bodies with divisions therein for placing the electronic equipments. However, the divisions are assembled either by nailing or by welding according to the different materials. The process thereof is very inconvenient and that is the main shortcoming of the conventional machine rack.

The present invention includes aluminum extruded joints and frame posts to be assembled for a machine rack body, which is disposed with a special face plate bracket to be directly placed inside the frame body by means of screws. The assembly of the present invention is more convenient and faster than the conventional ones.

SUMMARY OF THE INVENTION

The primary objective of the present invention is to dispose a face plate bracket in the form of a long plate on one side of a frame post of an aluminum extruded machine rack. Round (or oval) lock holes arranged at a certain interval are disposed on the plate body. The outer lateral end thereof is disposed with a bent portion in a n-shape. One side is extensively disposed with a right-angle bent edge. The bent edge of the face plate bracket is pressed and placed on the inner lateral rim of the frame post. Then, the convex bent portion in a n-shape is used as a support to adjoin with an expansion rod bracket, thereby to erect the electronic equipments such as a computer.

To enable a further understanding of the contents of the present invention, the brief description of the drawings below is followed by the detailed description of the preferred embodiment.

DETAILED DESCRIPTION OF THE PREFERRED EMBODIMENTS

Figure 1:
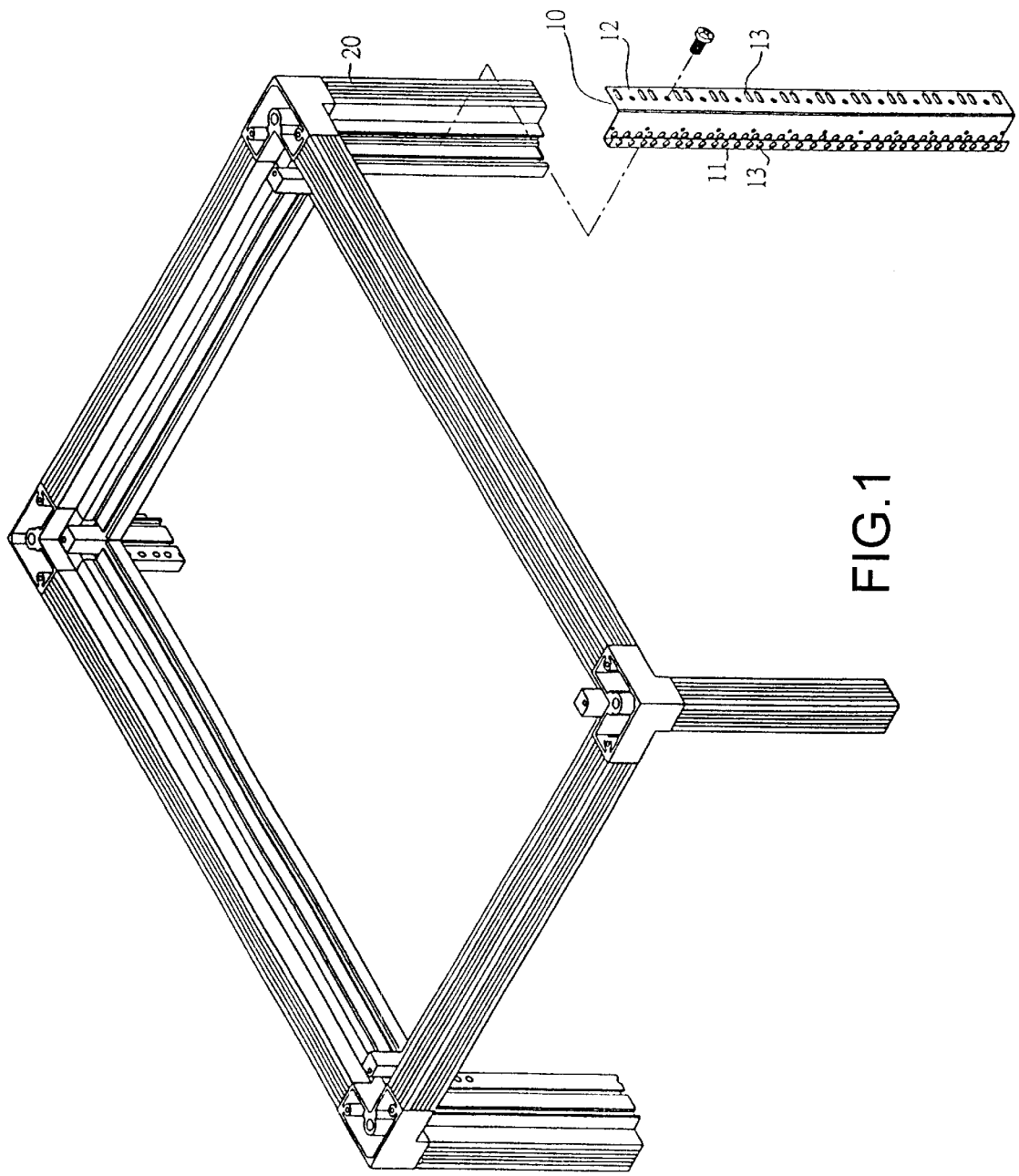
FIG. 1 is a drawing of the exemplary embodiment of the structure of the present invention.
Figure 3:
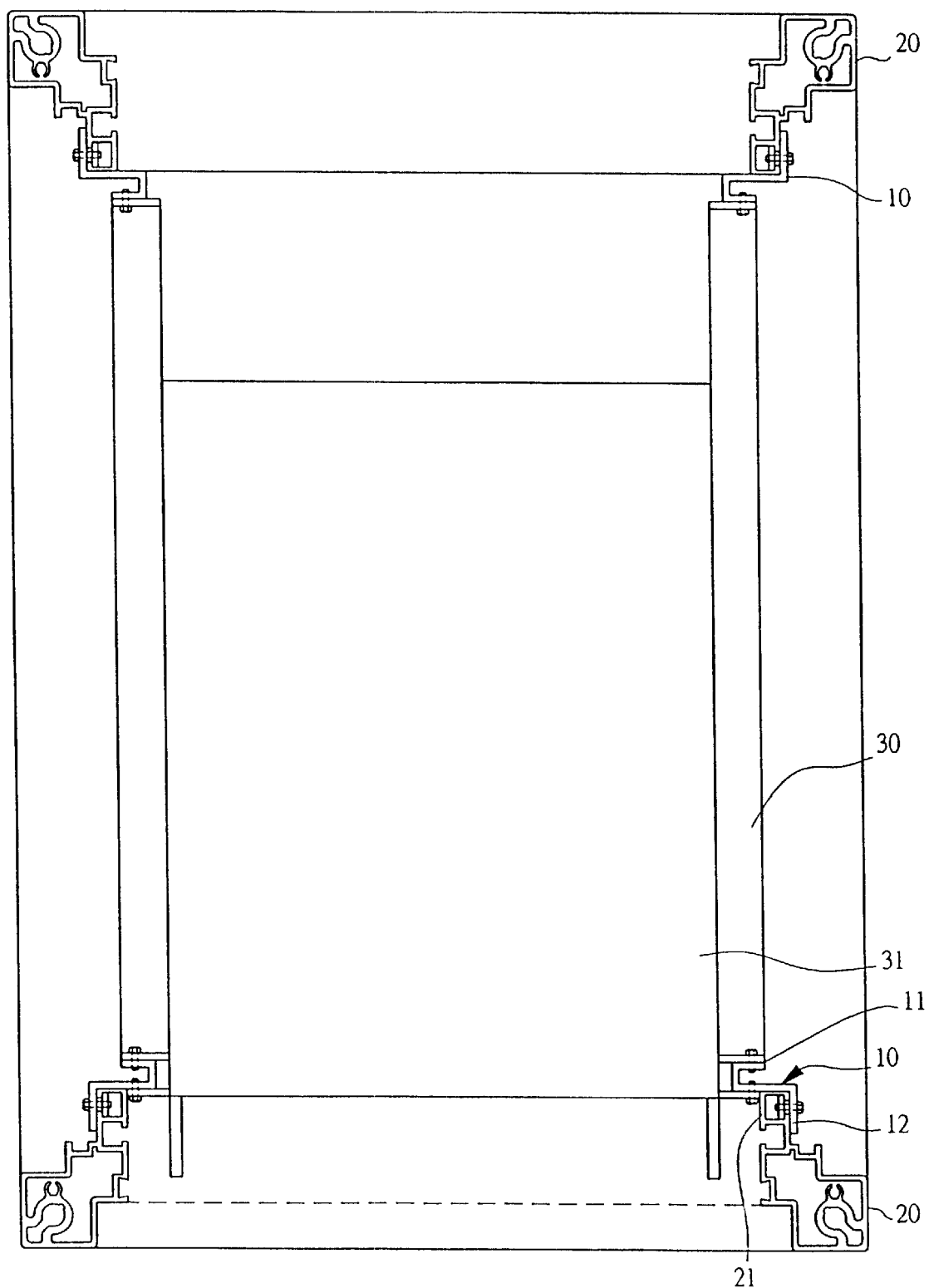
FIG. 3 is a +-p view drawing of the assembled structure of the present invention.

Referring to FIGS. 1 and 3, the face plate bracket (10) disposed in the present invention is in the form of a long plate body. The section thereof mainly has a right-angle bent edge (12) extending on one side, bending reversely and back again to form a bent portion in a n-shape (11). A round or oval lock holes (13) in a staggered arrangement are disposed at a certain interval on the bent portion (11) and the right-angle bent edge (12) of the face plate bracket (10).

Figure 2:
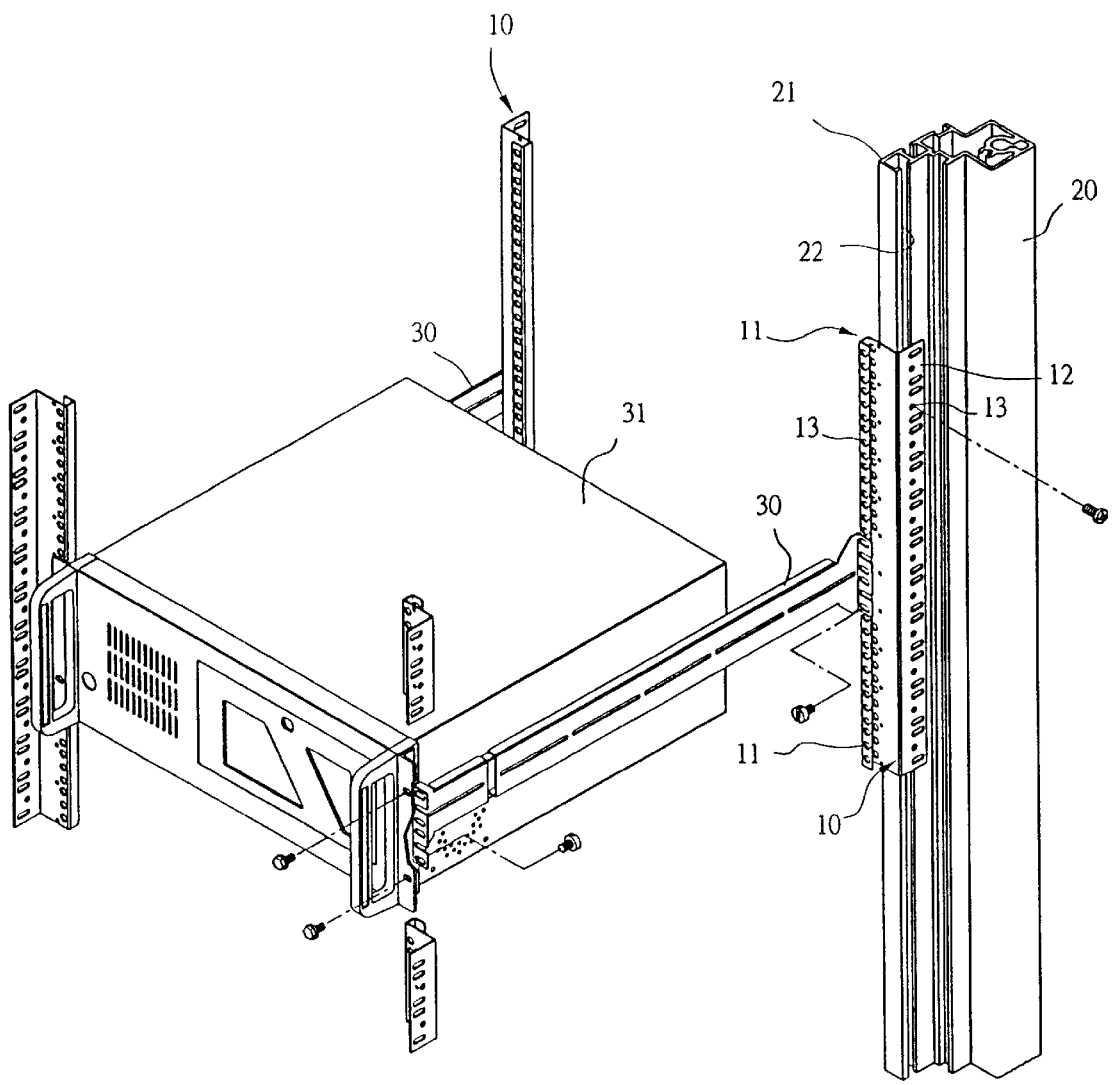
FIG. 2 is a drawing of the assembled structure of the present invention.

Referring to FIGS. 2 and 3, the present invention is assembled on the inner side of an aluminum extruded frame post (20) of the machine rack, wherein, the vertical aluminum frame post (20) has a convex portion (21) of a long concave slot (22) disposed on one side of the main square frame. The right-angle bent edge (12) of the face plate bracket (10) attaches the opposite lateral surface of the convex portion (21) of the frame post (20) between the opposite and bent portions (11) of two face plate brackets (10). Screws and nuts are used to fixedly lock an expansion rod bracket (30). Electronic assembling members such as a main set can be erected between the expansion rod brackets (30) on two sides of the machine rack and that makes the assembly of all the members very consistent.

Furthermore, the design of the bent portion in a n-shape (11) projecting on the face plate bracket (10) has lock holes (13) disposed on two opposing sides. Therefore, either side or both sides of the bent portion (11) can be screwed with related members thereon and that is the main feature of the present invention.

The present invention possesses special ideas of particularly making the right-angle bent edge of the face plate bracket a consecutive bending structure bending reversely and back again, to be screwed onto the aluminum frame post of the machine rack by cooperating with an expansion rod bracket for very fast erecting the electronic parts such as a main set. The application is more convenient than the conventional structure, the position can be adjusted freely up and down, the space variation is more and suitable for all the factories to make free space utilization, which is the greatest advantage of the present invention.

It is of course to be understood that the embodiment described herein is merely illustrative of the principles of the invention and that a wide variety of modifications thereby may be effected by persons skilled in the art without departing from the spirit and scope of the invention as set forth in the following claims.

What is claimed is:

1. A face plate bracket for a computer rack for shelving electronic equipment, comprising:
    a) an elongated plate body having a right-angle bent edge and with a single right-angle bend for adjoining to a frame post of a machine rack and an n-shaped bent portion with two right-angle bends for adjoining to an expansion rod bracket;
    b) a plurality of first lock holes in a spaced apart arrangement passing through opposite sides of the n-shaped bent portion;
    c) a plurality of second spaced apart lock holes passing through the right-angle bent edge.

2. A shelf assembly for shelving electronic equipment including a plurality of frame posts and comprising:
    a) a plurality of face plate brackets, one attached to each frame posts each bracket including:
        i) an elongated plate body having a right-angle bent edge and with a single right-angle bend for adjoining to a frame post of a machine rack and an n-shaped bent portion with two right-angle bends for adjoining to an expansion rod bracket;
        ii) a plurality of first lock holes in a spaced apart arrangement passing through opposite sides of the n-shaped bent portion;

iii) a plurality of second spaced apart lock holes passing through the right-angle bent edge;

whereby right-angle bent edge is adjoined to one of frame posts, and;

b) at least one expansion rod bracket adjoined to the n-shaped bent portion of opposing face plate brackets.

* * * * *